United States Patent
Kook et al.

(10) Patent No.: US 9,887,385 B2
(45) Date of Patent: Feb. 6, 2018

(54) ORGANIC LIGHT EMITTING DIODE DEVICE AND METHOD FOR MANUFACTURING THE SAME

(71) Applicant: LG Display Co., Ltd., Seoul (KR)

(72) Inventors: Yun-Ho Kook, Gyeonggi-do (KR); Tae-Joon Song, Gyeonggi-do (KR); Yong-Hee Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/585,483

(22) Filed: Dec. 30, 2014

(65) Prior Publication Data
US 2016/0064690 A1 Mar. 3, 2016

(30) Foreign Application Priority Data

Sep. 3, 2014 (KR) .......................... 10-2014-0116922

(51) Int. Cl.
- *H01L 51/52* (2006.01)
- *H01L 27/32* (2006.01)
- *H01L 51/56* (2006.01)

(52) U.S. Cl.
CPC ...... *H01L 51/5256* (2013.01); *H01L 27/3244* (2013.01); *H01L 51/52* (2013.01); *H01L 51/5253* (2013.01)

(58) Field of Classification Search
CPC ............. H01L 51/5256; H01L 51/5237; H01L 51/524; H01L 51/5253; H01L 51/5246;
(Continued)

(56) References Cited

U.S. PATENT DOCUMENTS

2007/0159089 A1* 7/2007 Oh ....................... H01L 27/3223
                                                                  313/506
2007/0291215 A1* 12/2007 Koo .................... H01L 51/5253
                                                                  349/153
(Continued)

FOREIGN PATENT DOCUMENTS

JP           2007335403 A        12/2007
JP           2012155987 A         8/2012

OTHER PUBLICATIONS

Office Action dated Aug. 2, 2016 from the Japanese Patent Office in counterpart Japanese application No. 2015-172745.
(Continued)

*Primary Examiner* — Jesse Y Miyoshi
*Assistant Examiner* — David Spalla
(74) *Attorney, Agent, or Firm* — Morgan, Lewis & Bockius LLP

(57) ABSTRACT

An organic light emitting diode display device and a method for manufacturing the same are disclosed where permeation of moisture and oxygen may be prevented. The organic light emitting diode display device includes a protective members including an first inorganic film formed on a substrate to completely cover an organic light emitting diode, an organic film formed on the first inorganic film, and a second inorganic film formed on the first inorganic film and the organic film, wherein the organic film includes a first organic pattern corresponding to upper and side parts of the organic light emitting diode, and at least one second organic pattern being spaced from the first organic pattern and surrounding the first organic pattern, and the second organic pattern has an upper surface having the same height as an upper surface of the first organic pattern.

20 Claims, 12 Drawing Sheets

(58) Field of Classification Search
CPC ....... H01L 51/525; H01L 33/44; H01L 33/52; H01L 33/54
See application file for complete search history.

(56) References Cited

U.S. PATENT DOCUMENTS

| | | | | |
|---|---|---|---|---|
| 2013/0126932 A1* | 5/2013 | Chen | ............... | H01L 51/5256 257/99 |
| 2013/0299789 A1* | 11/2013 | Yamazaki | ........... | H01L 51/5246 257/40 |
| 2013/0334959 A1* | 12/2013 | Wang | ............... | H01L 51/5256 313/512 |
| 2014/0131682 A1* | 5/2014 | Kim | ............... | H01L 51/5253 257/40 |
| 2014/0319474 A1* | 10/2014 | Kim | ............... | H01L 51/5256 257/40 |

OTHER PUBLICATIONS

Office Action dated May 30, 2017 from the Japanese Patent Office in counterpart Japanese application No. 2015-172745.

* cited by examiner

US 9,887,385 B2

ORGANIC LIGHT EMITTING DIODE DEVICE AND METHOD FOR MANUFACTURING THE SAME

This application claims the benefit of Korean Patent Application No. 10-2014-0116922, filed on Sep. 3, 2014, which is hereby incorporated by reference as if fully set forth herein.

BACKGROUND OF THE INVENTION

Field of the Invention

The present invention relates to an organic light emitting diode display device and a method for manufacturing the same.

Discussion of the Related Art

As a core technology of the information age, image display devices capable of displaying a variety of information on a screen are becoming increasingly thinner, lighter, and more portable and functional. In particular, organic light emitting diode display devices include organic light emitting diodes (OLEDs) which use a thin light emitting layer disposed between electrodes, thus advantageously enabling realization of a thin film like paper.

The organic light emitting diode includes a first electrode which is an anode connected to a thin film transistor formed in each sub-pixel region of a substrate, an emission layer and a second electrode which is a cathode. The organic light emitting diode emits light based on a driving current between the first and second electrodes. That is, based on the driving current, holes recombine with electrons in the organic light emitting layer to generate excitons, and thus the light is emitted upon transition of exitons to a ground state.

FIGS. 1A and 1B are sectional views illustrating a general organic light emitting diode display device.

As shown in FIG. 1A, the general organic light emitting diode display device includes a thin film transistor formed in each sub-pixel on the substrate 10 and an organic light emitting diode connected to the thin film transistor. The thin film transistor includes a semiconductor layer 15, a gate insulating film 20, a gate electrode 25, an interlayer insulating film 30, a source electrode 35s and a drain electrode 35d. The organic light emitting diode includes a first electrode 45, an organic light emitting layer 55 and a second electrode 60. The organic light emitting diode is distinguished from another organic light emitting diode of an adjacent sub-pixel by a bank insulation film 50.

Protective members 65, 70 and 75 are formed so as to cover the organic light emitting diode. The protective members 65, 70 and 75 are formed in a display region but also in a non-display region surrounding the display region so as to completely cover the organic light emitting diode. In addition, an encapsulation 85 such as a glass or film is adhered to the protective members 65, 70 and 75 by an adhesive agent 80 thereby bonding the encapsulation 85 to the substrate 10.

The protective members 65, 70 and 75 and the encapsulation 85 protect the organic light emitting diode from foreign matter such as moisture or oxygen. In general, foreign matter 95 permeates along the side surface of the organic light emitting diode display device which cannot be protected by the encapsulation 85. Accordingly, in the general organic light emitting diode display device, width of a region in which the adhesive agent 80 is formed should be increased in order that passage of moisture and oxygen permeated into the side surface is increased by the adhesive agent 80, as shown in FIG. 1B. However, in this case, it is impossible to implement a narrow bezel due to increased width of the non-display region.

SUMMARY OF THE INVENTION

Accordingly, the present invention is directed to an organic light emitting diode display device and a method for manufacturing the same that substantially obviate one or more problems due to limitations and disadvantages of the related art.

An object of the present invention is to provide an organic light emitting diode device and a method for manufacturing the same to implement a narrow bezel and efficiently prevent permeation of moisture and oxygen to an inside surface.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device comprises protective members formed to completely cover an organic light emitting diode.

The protective members includes a first inorganic film completely covering the organic light emitting diode, an organic film formed on the first inorganic film, and a second inorganic film formed on the first inorganic film and the organic film, wherein the organic film includes a first organic pattern corresponding to upper and side parts of the organic light emitting diode and at least one second organic pattern being spaced from the first organic pattern, surrounding the first organic pattern and having an upper surface with the same height as an upper surface of the first organic pattern.

A method for manufacturing an organic light emitting diode display device includes forming an organic film by an imprinting process using a mold.

The first inorganic film may contact the second inorganic film in a region where the first organic pattern is spaced from the second organic pattern, an edge of the first inorganic film may contact an edge of the second inorganic film, the first and second organic patterns may be completely surrounded with the first and second inorganic films, and an adhesive agent formed between the protective member and the encapsulation for bonding the substrate to the encapsulation is also formed in a region where the first organic pattern is spaced from the second organic pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and simultaneously with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, the organic light emitting diode display device according to the embodiment of the present invention will be described in detail with reference to the annexed drawings.

Figure 1A:
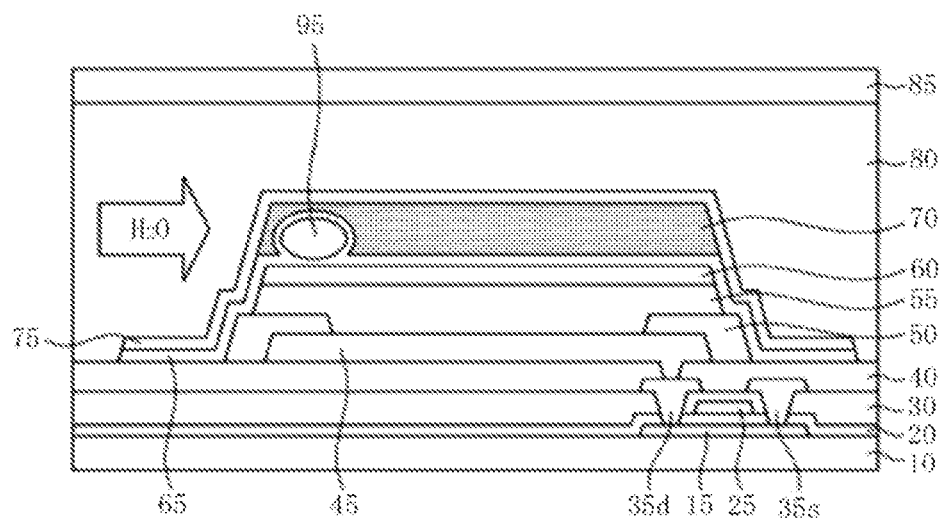
FIGS. 1A and 1B are sectional views illustrating a general organic light emitting diode display device.
Figure 1B:
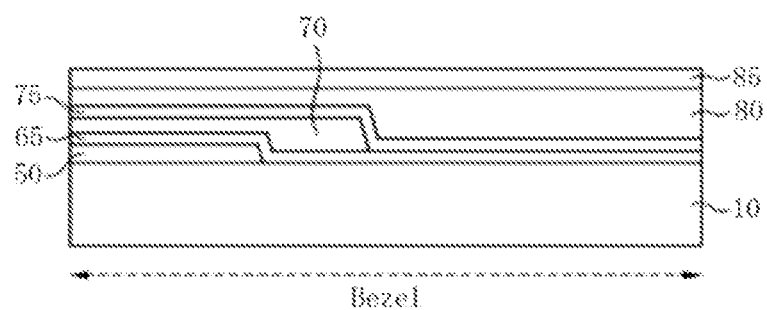
Figure 2:
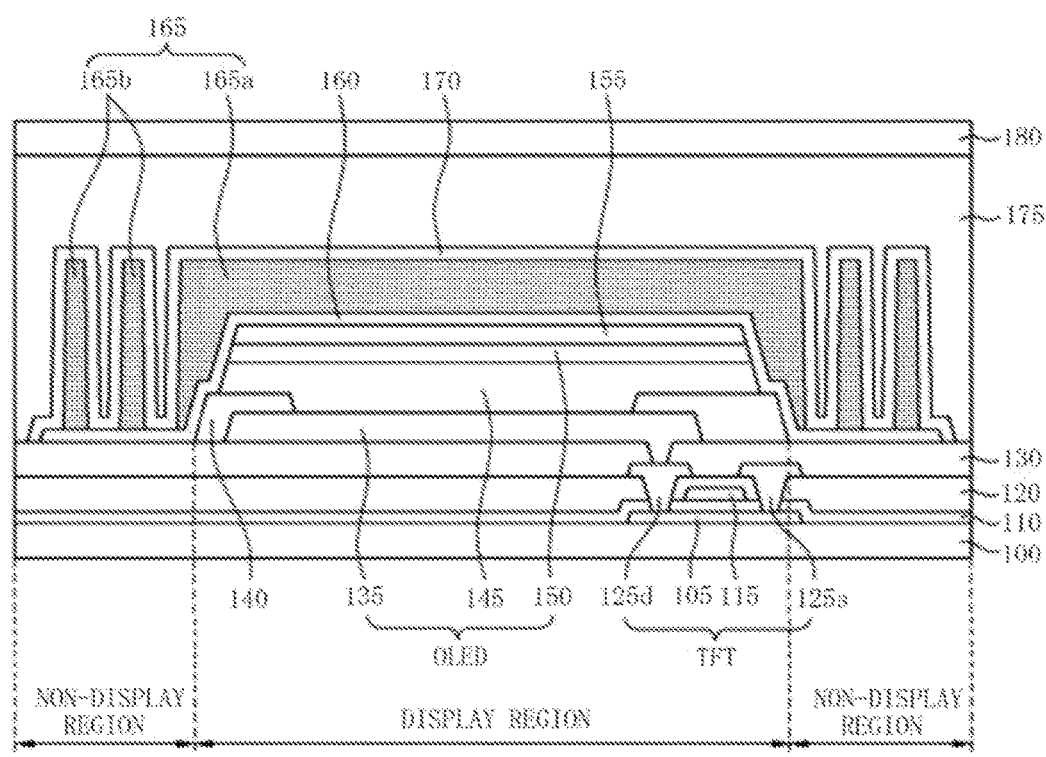
FIG. 2 is a sectional view illustrating an organic light emitting diode display device according to an example embodiment of the present invention.
Figure 3:
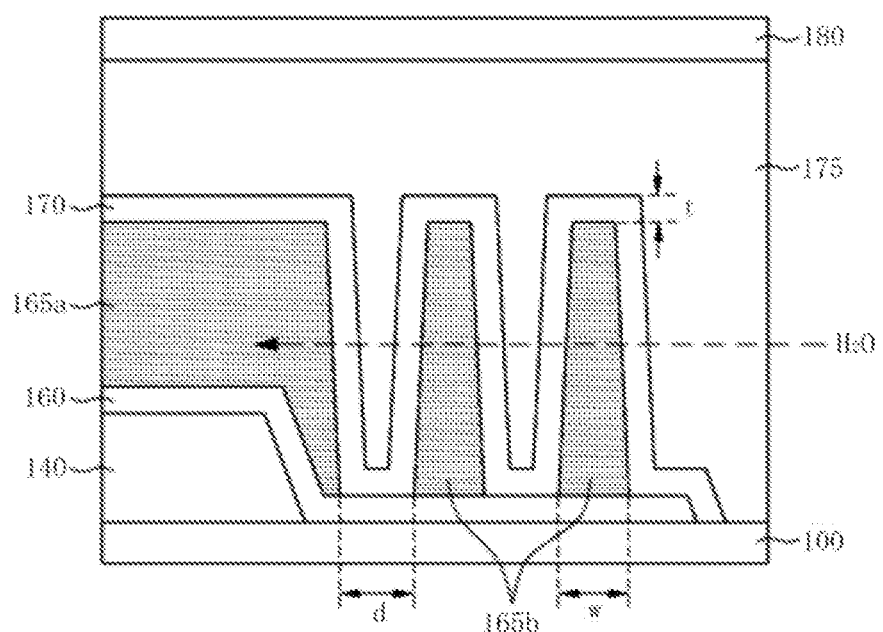
FIG. 3 is an enlarged view illustrating a non-display region of FIG. 2.
Figure 4A:
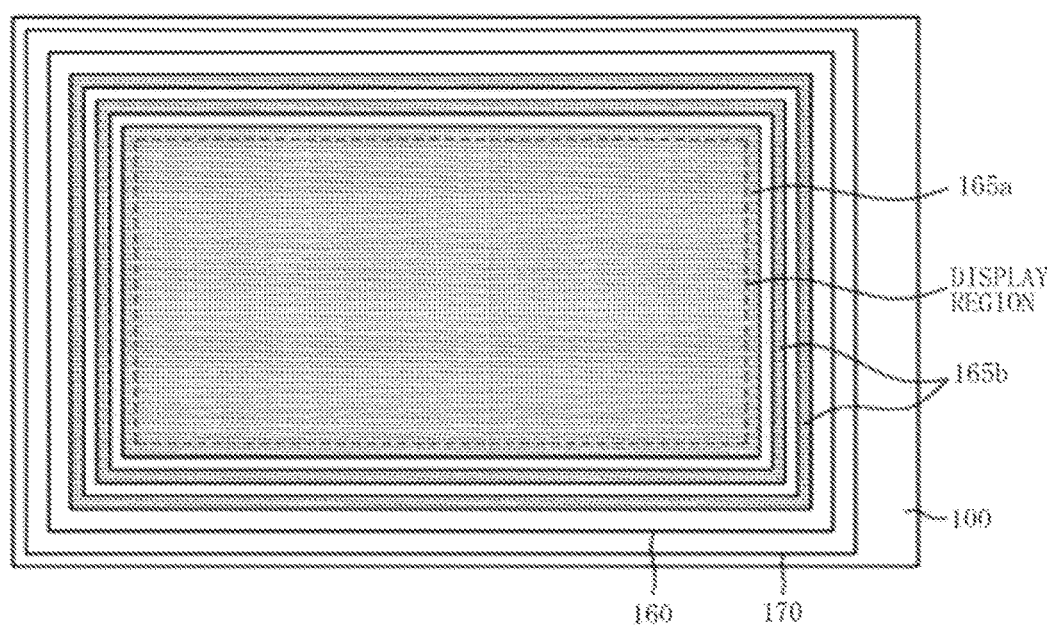
FIGS. 4A and 4B are plan views of an example protective member.
Figure 4B:
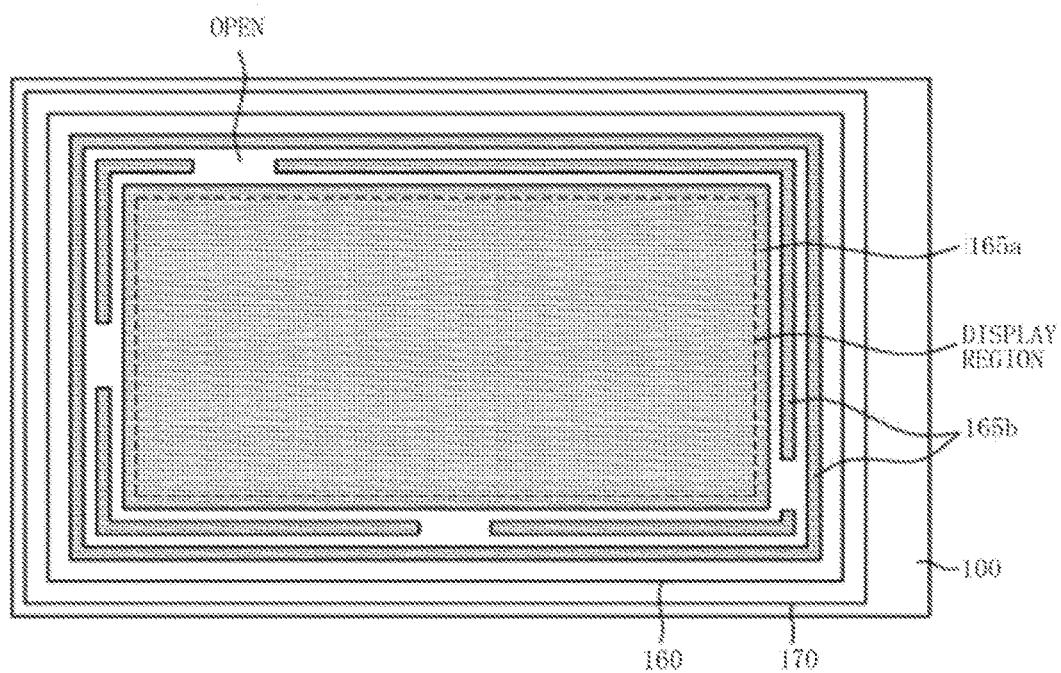

FIG. 2 is a sectional view illustrating an organic light emitting diode display device according to an example embodiment of the present invention and FIG. 3 is an enlarged view illustrating a non-display region of FIG. 2. In addition, FIGS. 4A and 4B are plan views of an example protective member.

As shown in FIG. 2, the organic light emitting diode display device according to the embodiment of the present invention includes a substrate 100 on which a display region including a plurality of sub-pixels and a non-display region are defined, a thin film transistor TFT and an organic light emitting diode OLED formed in each sub-pixel, a protective member completely covering the organic light emitting diode (OLED) and an encapsulation 180 bonded to the substrate 100 by an adhesive agent 175.

Specifically, gate lines and data lines intersect with each other to define a plurality of sub-pixels in the display region of the substrate 100. In addition, in each sub-pixel, a switching thin film transistor, a driving thin film transistor, a storage capacitor and an organic light emitting diode are formed. Only the driving thin film transistor TFT and the organic light emitting diode OLED are shown in the drawings.

The driving thin film transistor TFT includes a semiconductor layer 105 on the substrate 100, a gate electrode 115 formed on a gate insulation film 110 which covers the semiconductor layer 105, a source electrode 125s and a drain electrode 125d formed on an interlayer insulation film 120 which covers the gate electrode 115 and the gate insulation film 110. Although not shown, the semiconductor layer 105 includes a source region, a channel region and a drain region. The gate electrode 115 overlaps the channel region of the semiconductor layer 105 via the gate insulation film 110. The source electrode 125s and the drain electrode 125d are connected to the source region and the drain region of the semiconductor layer 105, respectively.

A first protective film 130 is formed so as to cover the driving thin film transistor. The first protective film 130 has a structure in which an inorganic material and an organic material are stacked. In addition, the organic light emitting diode OLED is formed on the first protective film 130. The organic light emitting diode includes a first electrode 135, an organic light emitting layer 145 and a second electrode 150.

The first electrode 135 is connected to the drain electrode 125d via a contact hole penetrating the first protective film 130. The first electrode 135 may be formed in a structure in which a non-transparent conductive material and a transparent conductive material are staked, when light emitted from the organic light emitting layer 145 is discharged through the encapsulation 180 Or the first electrode 135 may be formed of a transparent conductive material when light emitted from the organic light emitting layer 145 is discharged through the substrate 100.

In addition, a bank insulation film 140 for covering an edge portion of the first electrode 135 is formed between adjacent sub-pixels to define a light emission region of the organic light emitting diode and divides adjacent organic light emitting diodes.

The organic light emitting layer 145 is formed on the first electrode 135. The second electrode 150 is formed on the organic light emitting layer 145. The second electrode 150 may cover both the organic light emitting layers 145 and the bank insulation film 140 or may be formed on a sub-pixel basis, like the first electrode 135. The second electrode 150 may be formed of the transparent conductive material when light emitted from the organic light emitting layer 145 is discharged through the encapsulation 180. Or the second electrode 150 is formed of a non-transparent conductive material when light emitted from the organic light emitting layer 145 is discharged through substrate 100.

In addition, a second protective film 155 is formed on the second electrode 150. The second protective film 155 may be formed of an organic material so as to prevent damage of the second electrode 150 by foreign matter before formation of the protective members 160, 165 and 170.

In addition, the protective members 160, 165 and 170 for protecting the organic light emitting diode from foreign matter such as moisture or oxygen are provided on the second protective film 155. The protective members 160, 165 and 170 are formed in the display region but also in the non-display region so as to completely cover the organic light emitting diode. The protective members 160, 165 and 170 may be formed in a structure in which an inorganic film and an organic film are stacked. For example, the protective members may comprise the first inorganic film 160, the organic film 165 and the second inorganic film 170 which are stacked in this order as shown in the drawings. However, the structure of the protective members 160, 165 and 170 is not limited thereto.

Specifically, the first inorganic film 160 is formed of an inorganic material such as $SiN_x$, $SiO_x$, SiON, or $Al_2O_3$ on the first protective film 130 so as to cover the second protective film 155. The first inorganic film 160 is formed over the substrate 100 and completely covers the organic light emitting diodes formed in the display region in order to prevent permeation of foreign matter. Although not shown, a pad member formed on the non-display region of the substrate 100, is not covered by the first inorganic film 160. The first inorganic film 160 may have a thickness of 0.5 μm to 1.5 μm.

An organic film 165 is formed of an organic material such as benzocyclobutene (BCB) or acrylic resin on the first inorganic film 160. The organic film 165 is used for increasing flow passage of the permeated foreign matter. Therefore lifespan of the organic light emitting diode may be maintained by the organic film 165, although the foreign matter is permeated. In addition, the organic film 165 has a sufficient thickness to keep the surface flat although the foreign matter is permeated. For example, the thickness of the organic film 165 is preferably 15 μm to 25 μm.

The organic film 165 includes a first organic pattern 165a corresponding to upper and side surfaces of the organic light emitting diodes formed in the display region, and a second organic pattern 165b formed in the non-display region so as to surround the first organic pattern 165a.

Specifically, the first organic pattern 165a is formed to completely cover even the edge of the bank insulation film 140 via the first inorganic film 160 and therefore completely covers the organic light emitting diode. In view of the thickness of the first organic pattern 165a, a region of the first organic pattern 165a overlapping the organic light emitting diode is different from an outermost region of the first organic pattern 165a not overlapping the organic light emitting diode, and therefore the thickest region of the first organic pattern 165a is the outermost region of the first organic pattern 165a.

The second organic pattern 165b has an upper surface having the same height as an upper surface of the first organic pattern 165a and the second organic pattern 165b has the same thickness as the outermost region of the first organic pattern 165a. The second organic pattern 165b is formed in the non-display region, is spaced from the edge of the first organic pattern 165a by a predetermined distance and surrounds the periphery of the first organic pattern 165a. In this case, the number of the second organic pattern 165b may be at least one and two second organic pattern 165bs are shown in the drawing.

In addition, the second inorganic film 170 is formed on the organic film 165 so as to completely cover the organic film 165. The second inorganic film 170 is formed of an inorganic material such as $SiN_x$, $SiO_x$, SiON, or $Al_2O_3$ like the first inorganic film 160. The second inorganic film 170 may have a thickness of 0.5 μm to 1.5 μm. The second inorganic film 170 is formed along the surface of the organic film 165 and is connected to the first inorganic film 160 in a region where the first organic pattern 165a is spaced from the second organic pattern 165b. An edge of the first inorganic film 160 is also connected to an edge of the second inorganic film 170. Accordingly, the organic film 165 interposed between the first and second inorganic films 160 and 170 is completely surrounded by the first and second inorganic films 160 and 170.

Specifically, when the second organic pattern 165b has an excessively great width w, as shown in FIG. 3, the width of the non-display region is increased, thus making it impossible to implement a narrow bezel. Accordingly, the second organic pattern 165b preferably has a width w of several tens of nanometers (nm) to several tens of micrometers (μm). For example, the second organic pattern 165b preferably has a width w of 10 nm.

In addition, when the distance d between the first and second organic patterns 165a and 165b is excessively great, the narrow bezel cannot be implemented and, when the distance is excessively small, the second inorganic film 170 cannot be formed to a uniform thickness on the first and second organic patterns 165a and 165b.

Specifically, the distance d between the first and second organic patterns 165a and 165b should be greater than two times the thickness t of the second inorganic film 170. Because the second inorganic film 170 has a uniform thickness in the region where the first and second organic patterns 165a and 165b are spaced from each other and the second inorganic 170 is thus uniformly formed on the first and second organic patterns 165a and 165b.

In addition, when the distance d between the first and second organic patterns 165a and 165b is excessively small, the narrow bezel cannot be implemented. Accordingly, the distance d between the first and second organic patterns 165a and 165b is preferably smaller than the width w of the second organic pattern 165b in consideration of narrow bezel and process margin.

As shown in FIG. 4A, the first organic pattern 165a according to an embodiment of the present invention completely covers the organic light emitting diodes formed in the display region and at least one of the second organic pattern 165b is formed in the non-display region so as to surround the periphery of the first organic pattern 165a.

In particular, as shown in FIG. 4B, when two second organic patterns 165b are present, the outermost one of the second organic pattern 165b is formed in a shielding structure for completely surrounding the first organic pattern 165a and the other of the second organic pattern 165b adjacent to the first organic pattern 165a may have a partially open portion.

Again, referring to FIG. 2, the encapsulation 180 formed of a glass or film is bonded to the substrate 100 through the adhesive agent 175. The adhesive agent 175 is formed in even the region where the first organic pattern 165a is spaced from the second organic pattern 165b in order to completely cover the upper surface and the side surface of the protective members 160, 165 and 170. In this case, the adhesive agent 175 is formed of a resin for bonding the encapsulation 180 to the substrate 100 and increases passage of moisture and oxygen permeated into the side surface.

Accordingly, the organic light emitting diode display device according to the embodiment of the present invention is provided with the protective members 160, 165 and 170 having a multilayer structure in which a first inorganic film 160, an organic film 165 and a second inorganic film 170 are stacked, thereby preventing permeation of oxygen and moisture into the organic light emitting diode. In particular, the organic film 165 includes a first organic pattern 165a corresponding to upper and side parts of the organic light emitting diodes formed in the display region, and a second organic pattern 165b formed in the non-display region so as to surround the first organic pattern 165a, and the first and second organic patterns 165a and 165b are completely surrounded by the first and second inorganic films 160 and 170, thereby efficiently preventing permeation of oxygen and moisture from the side surface and implementing a narrow bezel.

For example, when the organic film 165 includes the first organic pattern 165a and one second organic pattern 165b, oxygen and moisture should pass through all of the adhesive agent 175, the second inorganic film 170, the second organic pattern 165b, the second inorganic film 170, the adhesive agent 175, the second inorganic film 170 and the first organic pattern 165a so that they are permeated into the organic light emitting diode from the side surface. Accordingly, the embodiment of the present invention efficiently prevents permeation of oxygen and moisture.

In particular, the second organic pattern 165b has a fine width of several tens of nanometers (nm) to several tens of micrometers (μm). Accordingly, the organic light emitting diode display device according to the embodiment of the present invention efficiently prevents permeation of oxygen and moisture without increasing the width of the non-display region reaching the edge of the substrate 100 in the display region, thus implementing a narrow bezel of 1 mm or less.

Hereinafter, a method for manufacturing an organic light emitting diode display device according to the embodiment of the present invention will be described with reference to the annexed drawings in detail.

FIGS. 5A to 5F are sectional views illustrating the method for manufacturing the organic light emitting diode display device according to an example embodiment of the present invention. In addition, FIGS. 6A to 6D are sectional views illustrating formation of the organic film of FIG. 5D in detail.

Figure 5A:
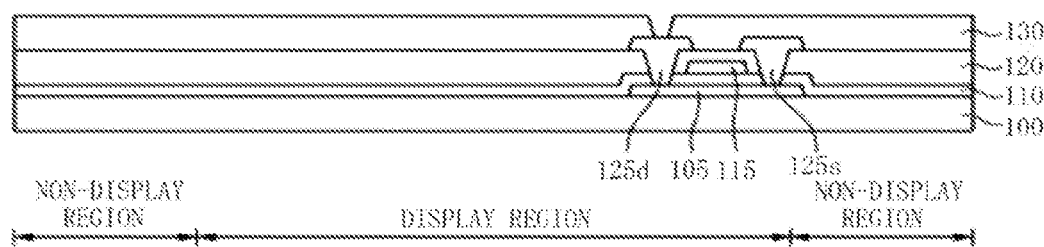
FIGS. 5A to 5F are sectional views illustrating the method for manufacturing the organic light emitting diode display device according to an example embodiment of the present invention.

As shown in FIG. 5A, a semiconductor layer 105 on the substrate 100, a gate electrode 115 on a gate insulation film 110, source and drain electrodes 125s and 125d on an interlayer insulation film 120 are formed in each of a plurality of sub-pixels defined by intersection of gate lines with data lines in the display region of the substrate 100, thereby forming a driving thin film transistor. Although not shown, a switching thin film transistor connected to the driving thin film transistor is further formed upon formation of the driving thin film transistor.

In addition, a first protective film 130 is formed using an organic material so as to cover the driving thin film transistor. And, a contact hole penetrating the first protective film 130 is formed by selectively removing the first protective film 130. At least a part of the drain electrode 120d of the driving thin film transistor is exposed by the contact hole. As shown in the drawings, the first protective film 130 is provided as a single layer, but the first protective film 130 may have a structure in which an organic material and an inorganic material are stacked.

Figure 5B:
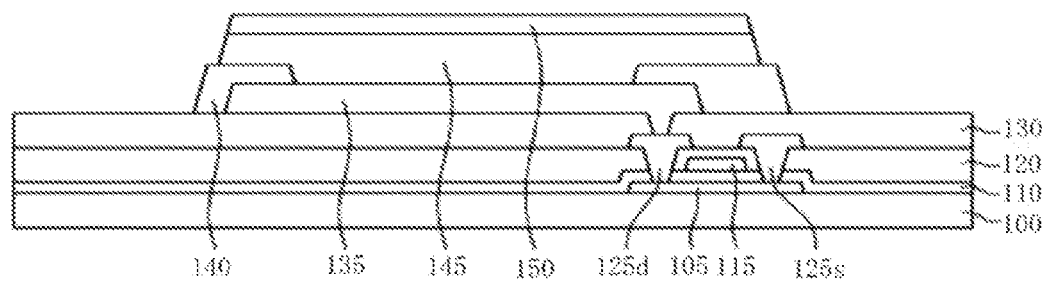

Then, as shown in FIG. 5B, an organic light emitting diode is formed on the first protective film 130. Specifically, a first electrode material is formed over the first protective film 130 including the contact hole and is then patterned to form a first electrode 135 connected to the drain electrode 125d through the contact hole. The first electrode 135 is connected to the driving thin film transistor in each sub-pixel and is divided on the sub-pixel basis.

In addition, an organic insulating material such as polyimide, photoacryl or benzocyclobutene (BCB) is applied to the entire surface of the substrate 100 including the first electrode 135 and is then patterned to form a bank insulation film 140 for exposing a part of the first electrode 135. The bank insulation film 140 is formed between adjacent sub-pixels to define a light emission region of the organic light emitting diode and distinguishes adjacent organic light emitting diodes from one another.

Then, an organic light emitting layer 145 is formed on the first electrode 135 exposed through the bank insulation film 140. In addition, a second electrode material is formed over the entire surface of the substrate 100 including the bank insulation film 140 and the organic light emitting layer 145 and is then patterned to form a second electrode 150. The second electrode 150 is integrally formed so as to cover the organic light emitting layers 145 and the bank insulation film 140 of the display region. In addition, a second protective film 155 is formed on the second electrode 150 to prevent damage to the first and second electrodes 135 and 150 and the organic light emitting layers 145 by the foreign matter permeated before formation of the protective members 160, 165 and 170. The second protective film 155 is formed of an organic material.

Figure 5C:
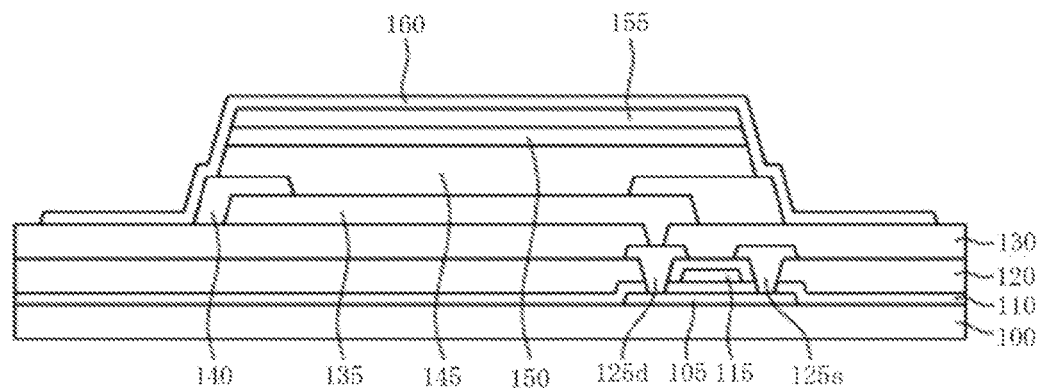

In addition, as shown in FIG. 5C, a material such as $SiN_x$, $SiO_x$, SiON, or $Al_2O_3$ is formed over the entire surface of the substrate 100 including the second protective film 155 by sputtering or CVD and is selectively removed to form a first inorganic film 160. The first inorganic film 160 is formed such that it completely covers the organic light emitting diodes formed in the display region and exposes a pad region of the substrate 100.

Figure 5D:
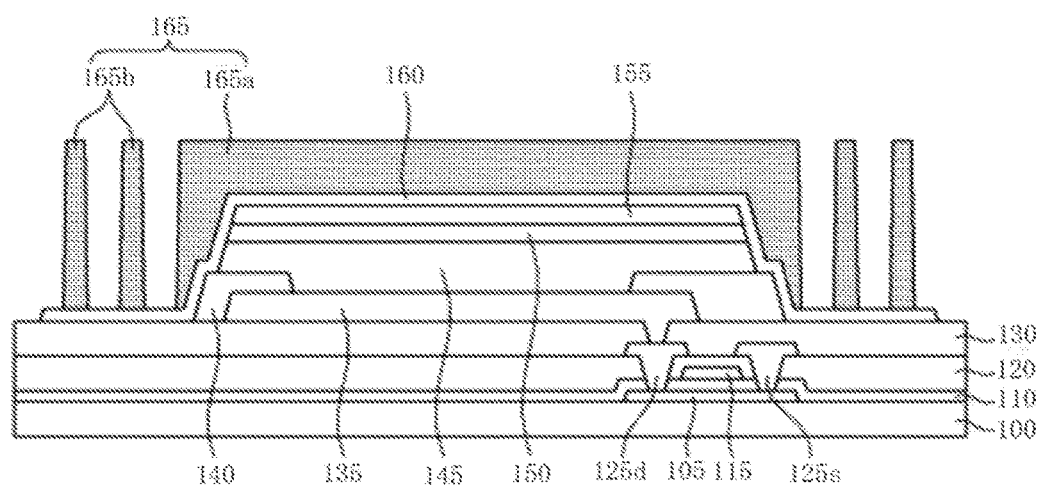

In addition, as shown in FIG. 5D, an organic film 165 including first and second organic patterns 165a and 165b is formed on the first inorganic film 160 by an imprinting process using an inorganic material.

Figure 6A:
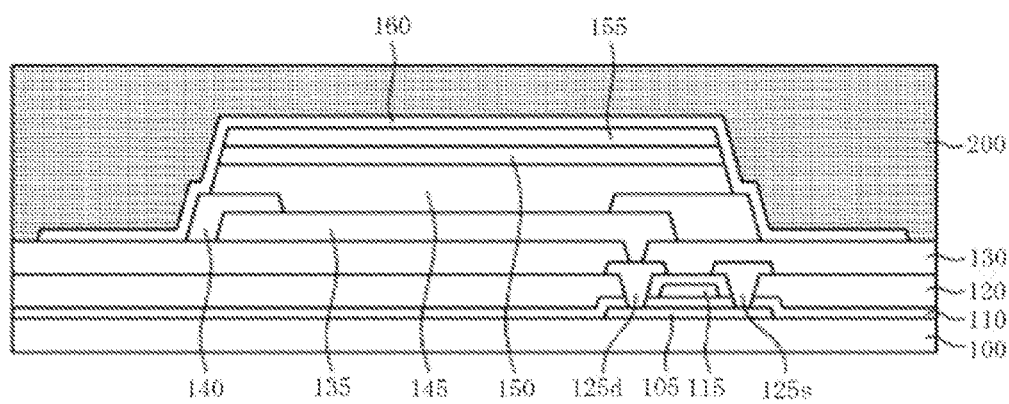
FIGS. 6A to 6D are sectional views illustrating formation of the organic film of FIG. 5D in detail.

Specifically, as shown in FIG. 6A, an organic material 200 such as a benzocyclobutene (BCB) or acrylic resin is applied to the entire surface of the substrate 100 including the first inorganic film 160. At this time, the organic material 200 has a sufficient thickness for planarization of the surface although foreign matter is permeated.

Figure 6B:
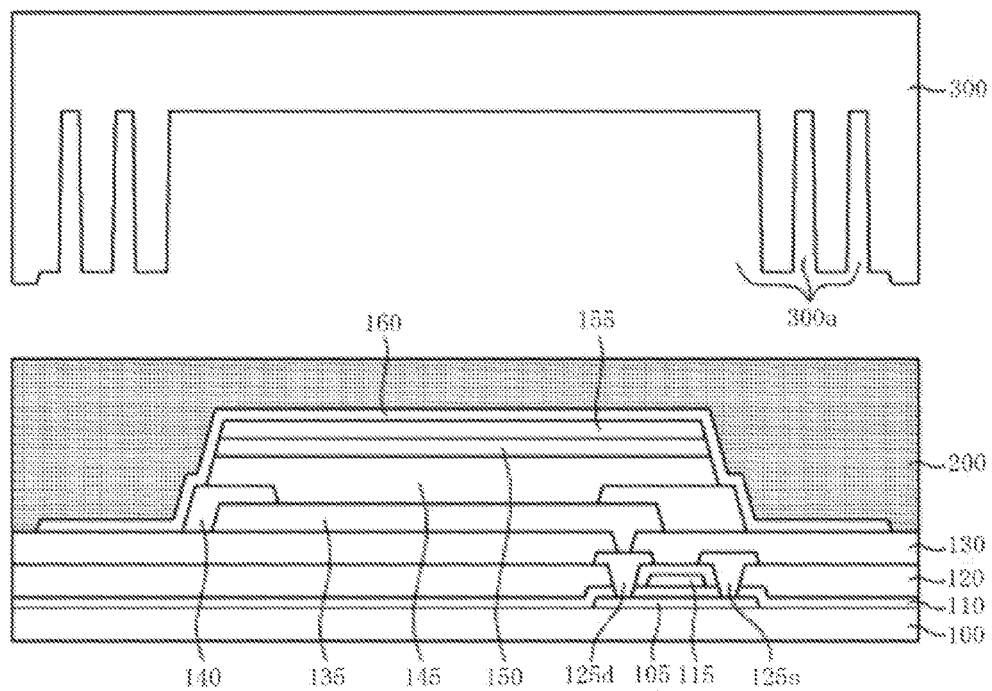

In addition, as shown in FIG. 6B, a mold 300 is placed on the organic material 200 under vacuum. The mold includes a recess 300a corresponding to a region where first and second organic pattern 165a and 165b are to be formed. The recess 300a is formed by etching or photolithography using electron beam so that the depth and width of the recess 300a can be easily controlled. At this time, the depth of the recess 300a corresponds to the thickness of the second organic pattern 165b. For example, the depth of the recess 300a may be 15 μm to 25 μm. In addition, the width of the recess 300a corresponds to the width of the second organic pattern 165b. For example, the width of the recess 300a may be several tens of nanometers (nm) to several tens of micrometers (μm).

Figure 6C:
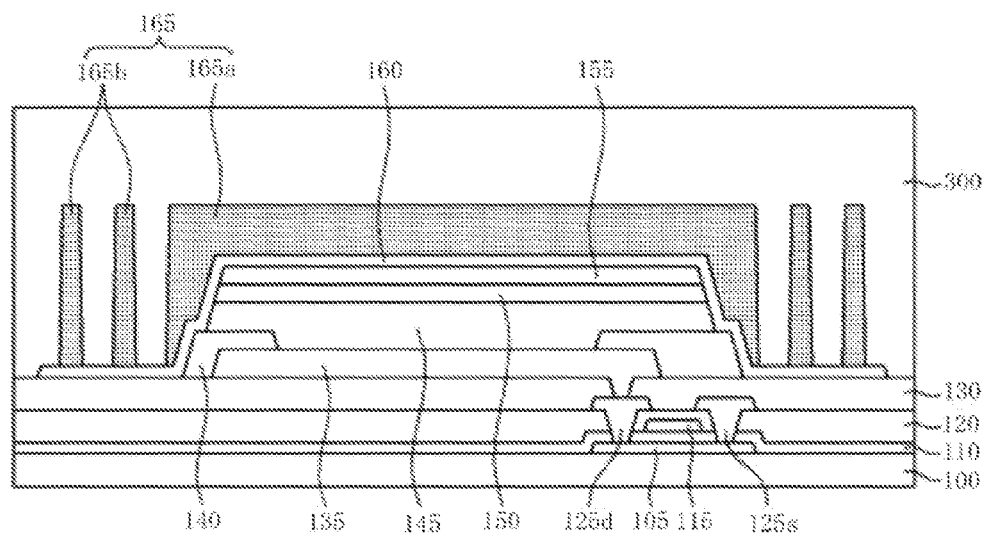

In addition, as shown in FIG. 6C, the mold 300 is adhered and pressed to the organic material 200 to fill the recess 300a of the mold with the organic material 200. Then, heat is applied or UV is emitted in a state that the mold 300 is adhered to the organic material 200 thereby curing the organic material 200. Accordingly, in the embodiment of the present invention, the organic material 200 is cured with the mold 300, thus preventing an edge of the organic material 200 from flowing down.

Figure 6D:
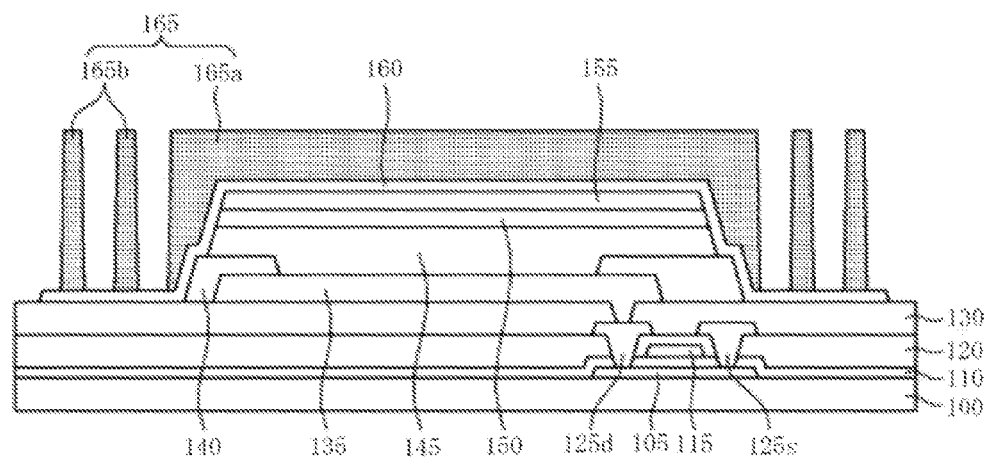

In addition, as shown in FIG. 6D, the mold 300 is removed from the cured organic material, as so to form first and second organic patterns 165a and 165b. Although not shown, a step of removing residue remaining around the first and second organic patterns 165a and 165b may be further applied.

The imprinting process enables formation of the recess 300a having a fine width in the mold 300 by using an electron beam or photolithography process, thus enabling formation of the second organic pattern 165b having a fine width. In addition, the imprinting process enables the first and second organic patterns 165a and 165b to be formed at accurate positions due to small bonding error (tolerance) between the substrate 100 and the mold 300.

The first organic pattern 165a corresponds to not only upper and side parts of the organic light emitting diode but also the side of the bank insulation film 140 via the first inorganic film 160 and thus completely covers the organic light emitting diode. Regarding the thickness of the first organic pattern 165a, a region of the first organic pattern 165a overlapping the organic light emitting diode is different from an outermost region of the first organic pattern 165a not overlapping the organic light emitting diode. That is, the thickest region of the first organic pattern 165a is the outermost region.

In addition, the second organic pattern 165b is formed in the non-display region such that the second organic pattern 165b is spaced from the edge of the first organic pattern 165a by a predetermined distance and surrounds the periphery of the first organic pattern 165a. The thickness of the second organic pattern 165b is the same as the thickness of the outermost region of the first organic pattern 165a. That is, the embodiment of the present invention efficiently prevents permeation of moisture and oxygen into the side surface because the second organic pattern 165b of the non-display region has a sufficient thickness.

Figure 5E:
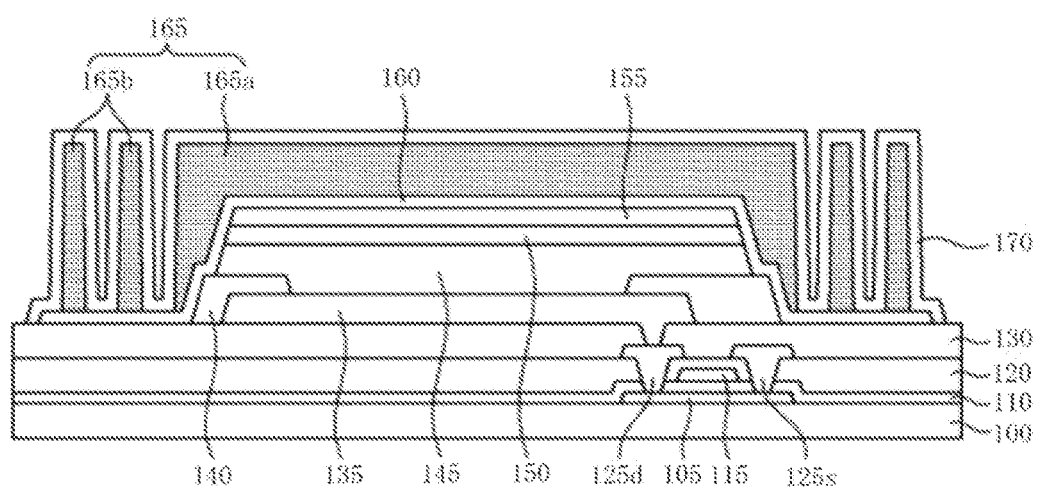

Then, as shown in FIG. 5E, a material such as $SiN_x$, $SiO_x$, SiON, or $Al_2O_3$ is formed by sputtering or CVD on the first inorganic film 160 and the organic film 165 and is then patterned to form a second inorganic film 170. The second inorganic film 170 is formed along the surface of the first and second organic patterns 165a and 165b, the first inorganic film 160 contacts the second inorganic film 170 in the region where the first organic pattern 165a is spaced from the second organic pattern 165b, and the edge of the first inorganic film 160 contacts the edge of the second inorganic film 170. Accordingly, the first and second organic patterns 165a and 165b are completely surrounded by the first and second inorganic films 160 and 170.

Accordingly, the organic light emitting diode display device according to the embodiment of the present invention includes protective members 160, 165 and 170 having a multilayer structure in which a first inorganic film 160, an organic film 165 and a second inorganic film 170 are stacked, thereby preventing permeation of oxygen and moisture into the organic light emitting diode without increasing a width of the bezel. In particular, the organic film 165 includes a first organic pattern 165a corresponding to upper and side parts of the organic light emitting diodes formed in the display region and a second organic pattern 165b formed in the non-display region so as to surround the first organic pattern 165a, and the first and second organic patterns 165a and 165b between the first and second inorganic films 160 and 170 are completely surrounded by the first and second inorganic films 160 and 170, thereby efficiently preventing permeation of oxygen and moisture from the side surface and implementing a narrow bezel.

Figure 5F:
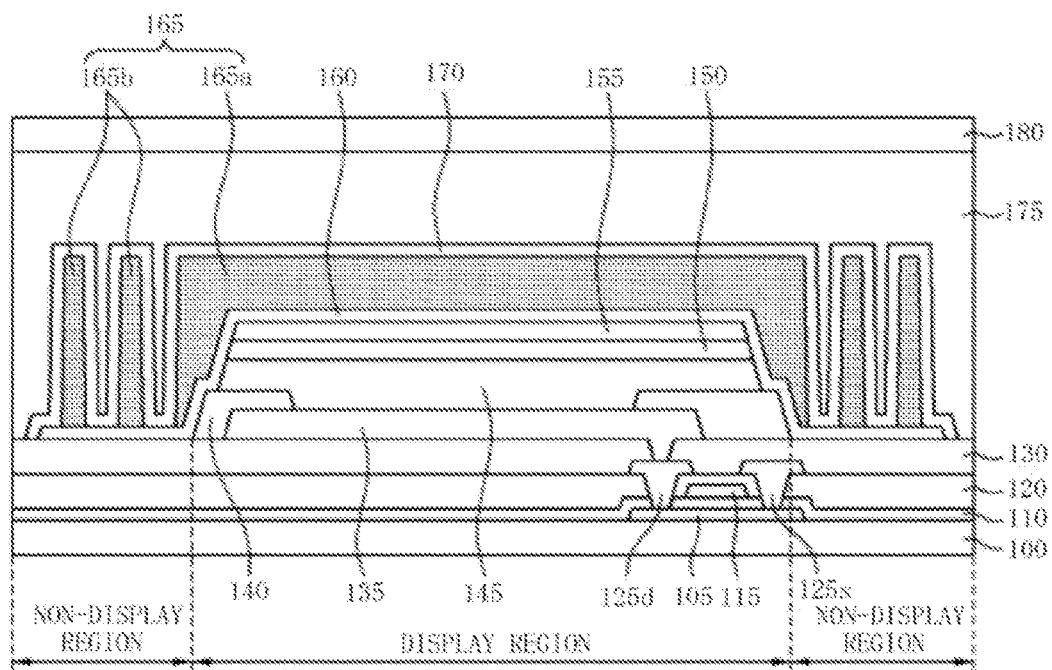

In addition, as shown in FIG. 5F, an adhesive agent 175 is applied to one surface of the encapsulation 180 formed of a glass or film and the substrate 100 provided with the protective members 160, 165 and 170 is disposed to face the encapsulation 180. The substrate 100 is then bonded to the encapsulation 180 by the adhesive agent 175.

The organic film is formed by the imprinting process according to the embodiment of the present invention described above, thereby enabling the organic light emitting diode display device to implement a narrow bezel and effectively preventing permeation of moisture and oxygen into the side surface.

In the general organic light emitting diode display device, the organic material is applied only when the organic film is formed by screen printing, thus causing a problem in which the organic material flows before curing of the organic material so that the inorganic film formed on the organic film does not sufficiently cover the edge of the organic film. Accordingly, to prevent this problem, the general organic light emitting diode display device further includes a structure for preventing the organic material from flowing into the non-display region, thus requiring a member having a size of several hundred of micrometers (μm) for forming the structure.

However, according to the embodiment of the present invention, the organic material 200 is applied over the entire surface of the substrate 100, is pressurized under vacuum using the mold 300 and cured while pressurizing the mold 300 in the formation of organic film 165 having a fine width by imprinting. Accordingly, it is possible to prevent the edge of the organic material 200 from flowing down. In particular, the thickness of the second organic pattern 165b is the same as that of the first organic pattern 165a formed on the organic light emitting diode and the second organic pattern 165b of the non-display region has a sufficient thickness. Accordingly, the embodiment of the present invention effectively prevents permeation of moisture and oxygen into the side surface.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode display device, comprising:
    a substrate having a display region including a plurality of sub-pixels and a non-display region disposed around the display region;
    a thin film transistor in each sub-pixel and an organic light emitting diode connected to each thin film transistor;
    a protective film between the thin film transistor and the organic light emitting diode;
    protective members including a first inorganic film over the substrate to completely cover the organic light emitting diode, an organic film on the first inorganic film, and a second inorganic film on the first inorganic film and the organic film; and
    an encapsulation adhered to an upper surface of the protective members by an adhesive agent, the encapsulation bonded to the substrate,
    wherein the organic film includes a first organic pattern covering upper and side parts of the organic light emitting diode with the first inorganic film therebetween, and at least one second organic pattern being spaced apart from the first organic pattern and surrounding the first organic pattern,
    wherein the first inorganic film directly contacts the second inorganic film in a region where the first organic pattern is spaced apart from the second organic pattern so that the first organic pattern is completely surrounded by the first and second inorganic films,
    wherein the second organic pattern has an upper surface having the same height as an upper surface of the first organic pattern, and
    wherein the first inorganic film directly contacts the protective film at a position corresponding to the region where the first organic pattern is spaced apart from the second organic pattern.

2. The organic light emitting diode display device according to claim 1, wherein an edge of the first inorganic film contacts an edge of the second inorganic film, so that the second organic pattern is completely surrounded by the first and second inorganic films.

3. The organic light emitting diode display device according to claim 1, wherein the adhesive agent between the encapsulation and the protective members for bonding the encapsulation to the substrate is also disposed in a region where the first organic pattern is spaced from the second organic pattern.

4. The organic light emitting diode display device according to claim 1, wherein the second organic pattern has a thickness of 15 μm to 25 μm.

5. The organic light emitting diode display device according to claim 1, wherein the second organic pattern includes a plurality of island loops.

6. The organic light emitting diode display device according to claim 5, wherein the island loops sectionally have a concavo-convex shape.

7. The organic light emitting diode display device according to claim 6, wherein the second inorganic film is disposed directly on the concavo-convex shape of the second organic pattern at the non-display region.

8. The organic light emitting diode display device according to claim 5, wherein at least one loop has at least one opening.

9. The organic light emitting diode display device according to claim 8, wherein the opening is surrounded by one of outer loops.

10. The organic light emitting diode display device according to claim 5, wherein a distance between the first organic pattern and the second organic pattern is smaller than a width of one of the island loops.

11. The organic light emitting diode display device according to claim 10, wherein a distance between the island loops is greater than double thicknesses of the second inorganic film.

12. The organic light emitting diode display device according to claim 1, wherein the first organic pattern has a first thickness above the organic light emitting diode and a second thickness greater than the first thickness at an edge of the first organic pattern.

13. The organic light emitting diode display device according to claim 12, wherein a thickness of the second organic pattern has a same thickness as the second thickness of the first organic pattern.

14. An organic light emitting diode display device, comprising:
a substrate having a display region including a plurality of sub-pixels and a non-display region disposed around the display region;
a thin film transistor in each sub-pixel and an organic light emitting diode connected to each thin film transistor;
protective members including a first inorganic film over the substrate to completely cover the organic light emitting diode, an organic film on the first inorganic film, and a second inorganic film on the first inorganic film and the organic film; and
a protective film between the thin film transistor and the organic light emitting diode,
wherein the organic film includes a first organic pattern covering upper and side parts of the organic light emitting diode, and at least one second organic pattern being spaced apart from the first organic pattern and surrounding the first organic pattern,
wherein the first inorganic film directly contacts the second inorganic film in a region where the first organic pattern is spaced apart from the second organic pattern so that the first organic pattern is completely surrounded by the first and second inorganic films, and
wherein the first inorganic film directly contacts the protective film corresponding to regions where the second organic pattern is spaced apart from the first organic pattern.

15. The organic light emitting diode display device according to claim 14, further comprising an encapsulation adhered to an upper surface of the protective members by an adhesive agent, the encapsulation bonded to the substrate.

16. The organic light emitting diode display device according to claim 14, wherein the second organic pattern has an upper surface having the same height as an upper surface of the first organic pattern.

17. The organic light emitting diode display device according to claim 16, wherein the second organic pattern has a thickness of 15 µm to 25 µm.

18. The organic light emitting diode display device according to claim 14, wherein an edge of the first inorganic film contacts an edge of the second inorganic film so that the second organic pattern is completely surrounded by the first and second inorganic films.

19. The organic light emitting diode display device according to claim 14, wherein the second organic pattern includes a plurality of island loops.

20. The organic light emitting diode display device according to claim 14, wherein the first organic pattern has a first thickness above the organic light emitting diode and a second thickness greater than the first thickness at an edge of the first organic pattern, and
wherein a thickness of the second organic pattern has a same thickness as the second thickness of the first organic pattern.

* * * * *